(12) United States Patent
Singh et al.

(10) Patent No.: US 6,561,706 B2
(45) Date of Patent: May 13, 2003

(54) CRITICAL DIMENSION MONITORING FROM LATENT IMAGE

(75) Inventors: Bhanwar Singh, Morgan Hill, CA (US); Michael K. Templeton, Atherton, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 9 days.

(21) Appl. No.: 09/893,807

(22) Filed: Jun. 28, 2001

(65) Prior Publication Data

US 2003/0002878 A1 Jan. 2, 2003

(51) Int. Cl.$^7$ .......................... G03D 5/00; G01N 21/00; G03C 5/00
(52) U.S. Cl. .................. 396/611; 356/237.5; 356/625; 250/559.04; 430/30
(58) Field of Search ................................ 396/567, 570, 396/580, 611; 355/27; 356/625, 634, 635, 237.5; 430/30; 438/14, 15, 16; 250/492.2, 559.04

(56) References Cited

U.S. PATENT DOCUMENTS

| | | | | |
|---|---|---|---|---|
| 5,393,624 A | * | 2/1995 | Ushijima | 118/52 |
| 5,867,276 A | * | 2/1999 | McNeil et al. | 356/445 |
| 5,923,423 A | * | 7/1999 | Sawatari et al. | 356/237.5 |
| 6,100,985 A | * | 8/2000 | Scheiner et al. | 250/341.1 |
| 6,259,521 B1 | * | 7/2001 | Miller et al. | 356/237.5 |
| 6,266,125 B1 | * | 7/2001 | Fukuda et al. | 118/712 |
| 6,388,253 B1 | * | 5/2002 | Su | 250/252.1 |
| 6,424,417 B1 | * | 7/2002 | Cohen | 356/388 |

* cited by examiner

Primary Examiner—Alan A. Mathews
(74) Attorney, Agent, or Firm—Amin & Turocy, LLP

(57) ABSTRACT

A system for monitoring a latent image exposed in a photo resist during semiconductor manufacture is provided. The system includes one or more light sources, each light source directing light to the latent image and/or one or more gratings exposed on one or more portions of a wafer. Light reflected from the latent image and/or the gratings is collected by a signature system, which processes the collected light. Light passing through the latent image and/or gratings may similarly be collected by the signature system, which processes the collected light. The collected light is analyzed and can be employed to generate feedback information to control the exposure. The collect light is further analyzed and can be employed to generate feed forward information that can be employed to control post exposure processes including development and baking processes.

11 Claims, 17 Drawing Sheets

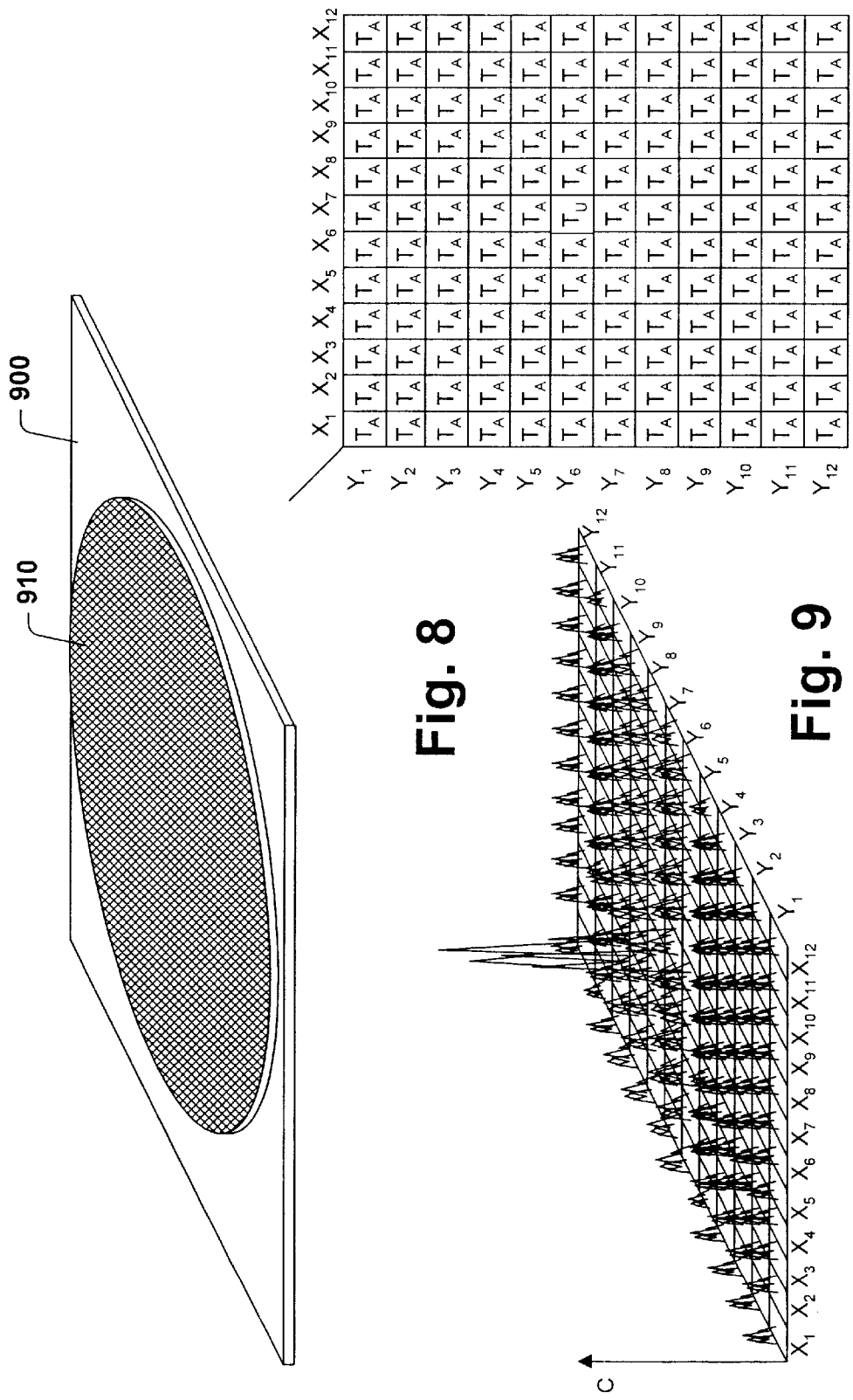

SURFACE NORMAL    SPECULARLY REFLECTED BEAM

CRITICAL DIMENSION MONITORING FROM LATENT IMAGE

TECHNICAL FIELD

The present invention relates generally to semiconductor processing, and in particular to a system for monitoring critical dimensions in a latent image and controlling exposure time, development time and/or post exposure bake time based on data generated from examining the latent image.

BACKGROUND

Integrated circuits require ever more precise features. Manufacturing more precise features requires more precise control of the surface geometry, such as corners and edges, of features. When feature sizes become smaller, ensuring that exposure time, development time and/or post exposure bake time will produce a pattern with desired critical dimensions on a wafer becomes more important.

The process of manufacturing semiconductors involves creating several patterned layers on and into a substrate that ultimately forms the complete integrated circuit. This layering process creates electrically active regions in and on the semiconductor wafer surface. The precision with which the electrically active regions can be created is important in achieving desired critical dimensions in the chips. Such precision is affected by the ability to control exposure, development and post exposure baking properties.

An exposure of a pattern may produce a latent image in a photo resist that, if exposed to inappropriate post exposure development conditions and/or post exposure baking conditions, may not produce desired critical dimensions, thus reducing chip manufacturing efficiency and chip quality. Exposure time can affect such the critical dimensions that will be achieved when a pattern is exposed, as can development properties (e.g., time, temperature) and post exposure bake properties (e.g., time, temperature). One or more patterns may be exposed on several layers formed (e.g., deposited and/or grown) on a wafer. Each such pattern may be affected by variations in a wafer (e.g., center to edge variations). Thus, a first exposure time that can be employed to expose a first pattern on a first layer and achieve acceptable critical dimensions, may not be similarly achieve acceptable critical dimensions for a second pattern on a second layer.

Similarly, a first set of development properties and/or a first set of post exposure bake properties that can be employed to develop and bake a first pattern on a first layer with acceptable critical dimensions may not similarly achieve acceptable critical dimensions for a second pattern on a second layer, due to wafer to wafer variations, variations between lots of wafers, and/or variations in prior manufacturing steps (e.g., exposure). Uniformity of critical dimensions between layers can improve IC quality leading to higher clocking speeds and resulting improved performance for such ICs.

Exposing the photo resist with the mask pattern produces a latent image on the photo resist. The intensity of the light, the length of exposure, and the focusing of the lens affect the properties of the latent image on the resist (e.g., depth of features, width of features, slope of feature edges). Conventionally, the exposure properties (e.g., length of exposure, dose, intensity) were pre-calculated. Such predetermined calculations may not produce exposure conditions that will yield desired critical dimensions due to, for example, variations between wafers. Thus, patterns may be produced with features that whose critical dimensions do not fall within expected ranges. Departures from expected properties in the latent image produced on the photo resist may produce undesired results in subsequent manufacturing steps (e.g., overexposure creating features that are too deep, underexposure creating features that are too shallow). Conventionally, development properties and/or post exposure properties may similarly be pre-calculated, not based on in situ information gathered from the latent image exposed on the photo resist.

SUMMARY

The following presents a simplified summary of the invention in order to provide a basic understanding of some aspects of the invention. This summary is not an extensive overview of the invention. It is not intended to identify key or critical elements of the invention nor is it intended to delineate the scope of the invention. Its sole purpose is to present some concepts of the invention in a simplified form as a prelude to the more detailed description that is presented later.

The present invention provides a system that facilitates monitoring the exposure of a pattern into a photo resist, and the latent image produced by such exposure, in semiconductor manufacturing. The present invention further provides a system that facilitates generating information from analysis of the light reflected from the latent image in the resist layer and feeding forward such generated information to control a subsequent development process and/or a subsequent post exposure process. Monitoring and controlling the exposure with runtime feedback provides superior exposure control and thus facilitates achieving desired critical dimensions, with substantial uniformity in such critical dimensions between layers. Similarly, controlling subsequent manufacturing processes and/or apparatus based on data collected from monitoring a previous manufacturing process facilitates accounting for variations between wafers and/or variations between exposures, which facilitates achieving desired critical dimensions.

An exemplary system may employ an exposing system that includes one or more light sources arranged to project light onto a latent image exposed on a photo resist. The latent image may include one or more gratings on one or more portions of a wafer, the gratings facilitating analyzing properties of the latent image exposed in the photo resist. The system may also include one or more light sensing devices (e.g., photo detector, photodiode) for detecting light reflected by, and/or allowed to pass through, the latent image and/or one or more gratings in the latent image. The light reflected from, and/or passing through the latent image and/or one or more gratings in the latent image is indicative of at least one parameter of the exposure (e.g., depth dimensions, width dimensions, chemical composition changes). The determined parameters can then be employed to determine properties associated with developing the pattern exposed into the photo resist and feeding forward control information based on such determinations to the subsequent development process. Similarly, the determined parameters can be employed to determine properties associated with baking the pattern exposed into the photo resist and feeding forward control information based on such determinations to the subsequent baking process. Thus, subsequent manufacturing processes can respond to the actual manufacturing results produced in prior manufacturing processes, facilitating calculating more optimal conditions for the subsequent processes, resulting in higher quality, more uniform chips.

An exposing system is arranged to facilitate projecting a pattern onto a layer on a wafer. The exposing system may be, for example, a light and lens combination found in a stepper apparatus. It is to be appreciated that any suitable exposing system can be employed with the present invention. Exposure systems may to change exposure conditions including, but not limited to, duration, focus, phase, intensity and dose. Thus, exposure conditions may not be identical from exposure to exposure. Therefore, the results of exposing a pattern into a photo resist layer may vary from exposure to exposure. Further, there may be variations between wafers, again leading to variations between exposures. The latent image produced by an exposure can be analyzed by comparing signatures generated by the light reflected and/or passed through the latent image and/or gratings in the latent image to desired signatures. By comparing desired signatures to measured signatures, runtime feedback can be employed to more precisely control exposure. Similarly, by comparing desired signatures to measured signatures, runtime feed forward information can be generated that facilitates controlling subsequent manufacturing processes. Such feeding back and feeding forward facilitates achieving desired critical dimensions in the pattern to be developed on the wafer, which in turn increases fidelity of image transfer. The increased fidelity can lead to achieving desired critical dimensions, and can further lead to substantial uniformity of critical dimensions between layers, which in turn facilitates achieving higher speeds in such chips.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 is a perspective illustration of a substrate, including photo resist, wherein the photo resist may have a latent image exposed thereon, the latent image including zero or more gratings, in accordance with an aspect of the present invention.

FIG. 9 is a representative three-dimensional grid map of a wafer illustrating signature measurements taken at grid blocks of the grid map in accordance with an aspect of the present invention.

FIG. 10 is a signature measurement table correlating the signatures of FIG. 10 with desired signatures in accordance with the present invention.

DETAILED DESCRIPTION

In the following description, for purposes of explanation, numerous specific details are set forth in order to provide a thorough understanding of the present invention. It will be evident to one skilled in the art, however, that the present invention may be practiced without these specific details. In other instances, well-known structures and devices are shown in block diagram form in order to facilitate description of the present invention.

As used in this application, the term "component" is intended to refer to a computer-related entity, either hardware, a combination of hardware and software, software, or software in execution. For example, a component may be, but is not limited to being, a process running on a processor, a processor, an object, an executable, a thread of execution, a program, a set of co-operating computers and/or processes and a computer.

It is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks may be employed).

Figure 1:
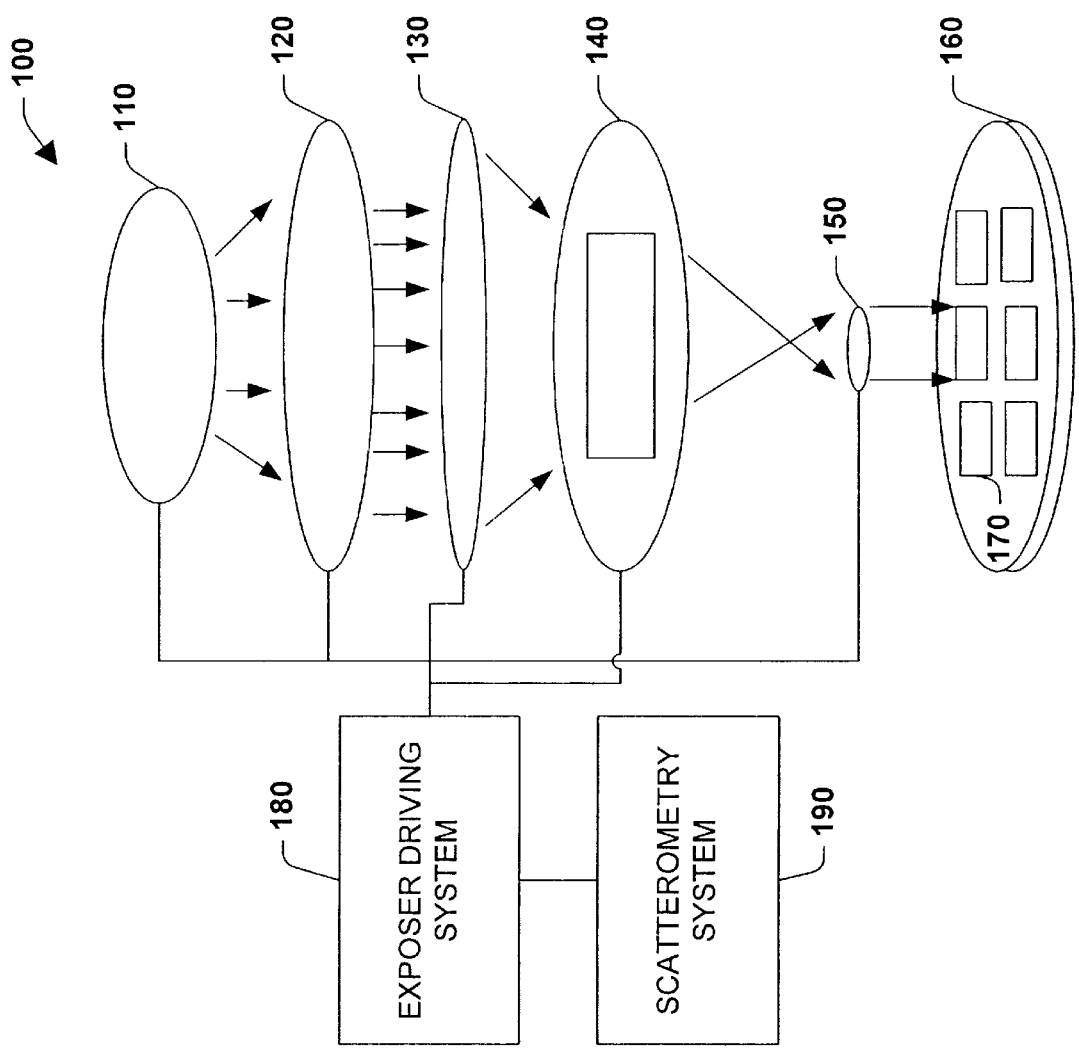
FIG. 1 is a schematic block diagram of an exposing system employed in accordance with an aspect of the present invention.

Referring initially to FIG. 1, an exposing system 100 is illustrated. The system 100 can be employed to expose a pattern into a photo resist layer, for example. The system 100 includes an illumination source 110. An illumination produced by the illumination source 110 can be controlled by, for example, modulating power supplied to the illumination source 110. The exposing system 100 can also include an illumination modification filter 120, (e.g., a pupil filter) which can be employed to modulate the intensity and/or phase of light spatially. The exposing system 100 can also include a lens system 130 and a lens system 150, each of which can be positionally controlled (e.g., vertically) to adjust a focus of a light passing through the lens system 130 and the lens system 150. The exposing system 100 can also include a mask/reticle 140, which can be employed to expose a pattern 170 on a wafer 160. Dimensions of features formed by exposing a pattern into a photo resist using the system 100 can thus depend on the configuration of several cooperating elements (e.g., illumination source 110, illumination filter 120, lenses 130 and 150, and reticle 140) during exposure. Thus, variations between exposures are possible. Conventionally, differences in properties of a latent image exposed into a photo resist may not be accounted for in subsequent manufacturing processes. But the present invention facilitates collecting information concerning the latent image formed in the photo resist, and thus facilitates adapting and controlling subsequent manufacturing processes (e.g., development, post exposure baking) based on such collected information.

In one alternative aspect of the present invention, one or more of the illumination source 110, the illumination modification filter 120, the lens system 130, the mask/reticle 140 and the lens system 150 can be operably connected to an exposure driving system 180. The exposure driving system 180 can be operably connected to a scatterometry system 190 such that the scatterometry system 190 can collect signature data and provide feedback/feedforward information concerning the formation of the one or more patterns 170 on the wafer 160. Such feedback/feedforward information can be employed to determine when to end the exposing process, for example. Furthermore, such feedback/feedforward information can be employed in machine learning techniques to adapt future operation of the exposing system 100. The signature data can also be employed to control subsequent processes including, but not limited to, development and post exposure baking.

Figure 2:
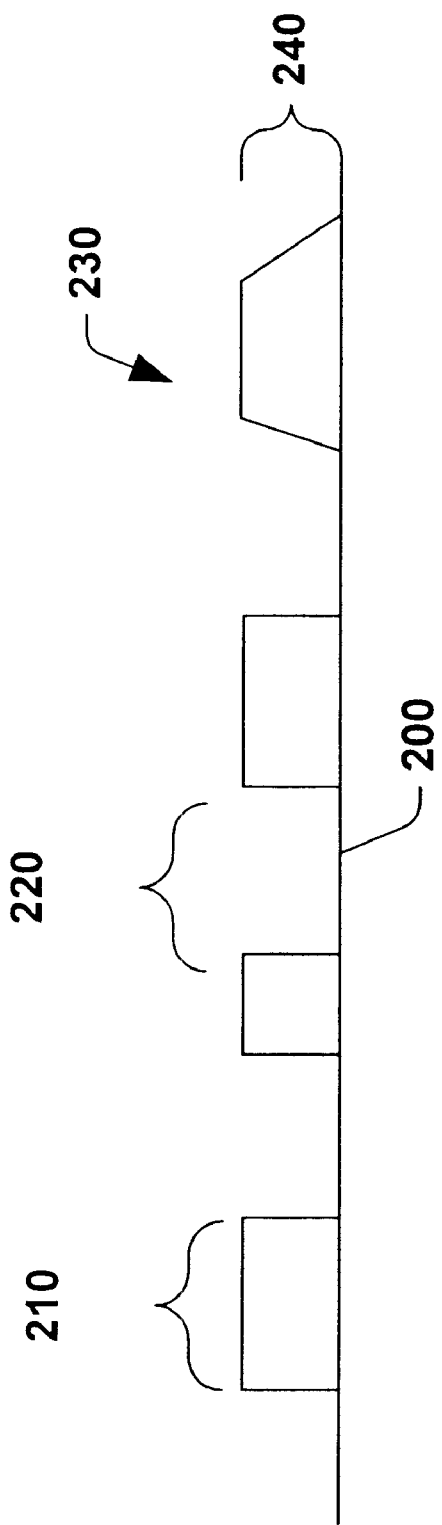
FIG. 2 illustrates measurements associated with determining critical dimensions in a latent image exposed in a photo resist in accordance with an aspect of the present invention.

Referring now to FIG. 2, a front view of a layer 200 on a wafer that has been developed, baked and etched is illustrated. The layer 200 includes several features that have measurable dimensions. For example, dimensions including, but not limited to, the width 210 of a feature, the distance 220 between features, the slope 230 of the sides of a feature and the height 240 of a feature. The dimensions (e.g., width 210, spacing 220, slope 230, height 240) depend, at least in part, on the dimensions of features in a latent image exposed into a photo resist during a prior manufacturing process, which image was subsequently employed in development and baking. Conventionally, the range of the dimensions (e.g., width 210, spacing 220, slope 230, height 240) depended on the range of the dimensions (e.g., width, spacing, slope, height) in the latent image, and adjustments to post exposure processes could not be made post exposure. However, the present invention facilitates measuring dimensions (e.g., width, spacing, slope, height) in the latent image exposed in the photo resist and thus facilitates feeding forward information to post exposure processes that can lead to improved dimensions (e.g., width 210, spacing 220, slope 230, height 240) on the layer 200, providing improvements over conventional systems in chip quality, reliability and/or uniformity.

Figure 3:
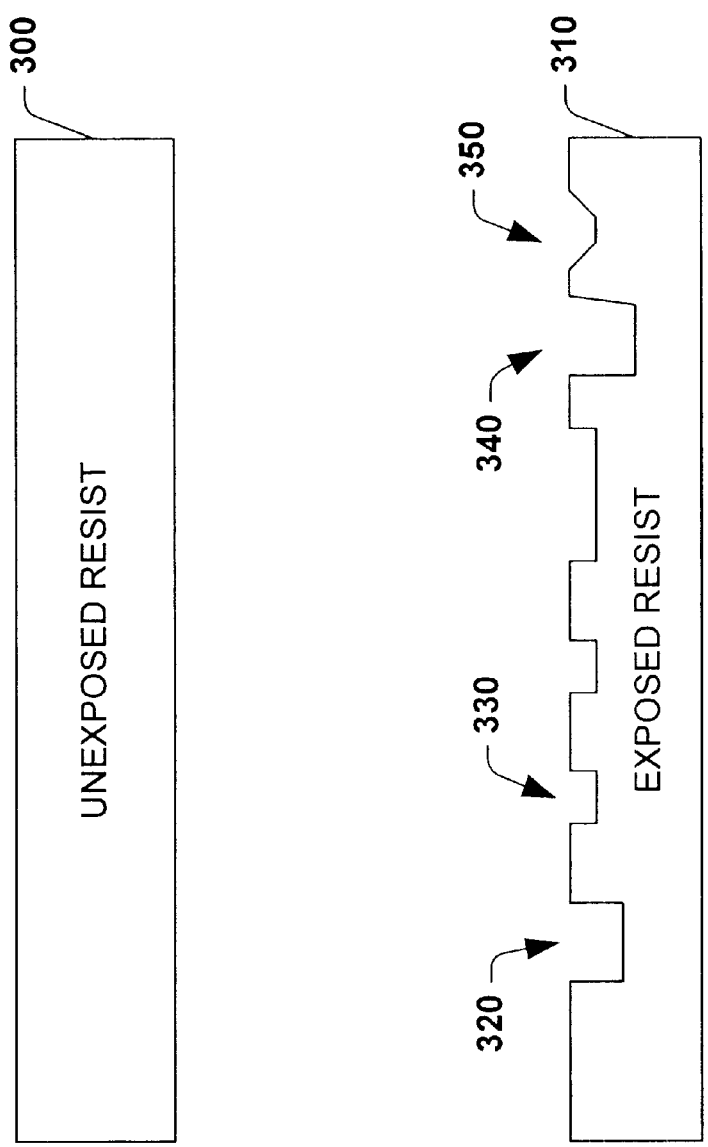
FIG. 3 illustrates an unexposed resist and an exposed resist with a latent image exposed thereon, in accordance with an aspect of the present invention.

Turning now to FIG. 3, a front view of an unexposed photo resist 300 and an exposed resist 310 are illustrated. Dependent on prior manufacturing processes, the unexposed resist 300 typically has measured properties including, but not limited to, a width within predetermined width thresholds, a chemical composition within desired chemical composition ranges and a uniformity within predetermined uniformity thresholds. However, although prior manufacturing processes may produce an unexposed resist 300 within all tolerances, the prior manufacturing processes may produce an unexposed resist 300 with different thickness, chemical compositions and/or uniformities due to variations in the manufacturing processes and/or variations in the wafer upon which the resist is deposited. Thus, it is possible that unexposed resists may have different properties. Thus, when the unexposed resist 300 is exposed to a pattern that creates a latent image in the resist, the latent image may have different properties.

By way of illustration, the exposed resist 310 may have a first feature 320 with a first depth and a second feature 330 with a second depth. Scatterometry techniques can be employed to determine, for example, the depths of the features 320 and/or 330 and to determine what, if anything, those depths indicate concerning exposure. Scatterometry techniques can also be employed to determine, based on the depths of the features 320 and/or 330, for example, development times and/or temperatures and/or post exposure bake times and/or temperatures to be applied to the exposed resist 310. For example, different depths may generate different signatures that indicate one or more exposure results and which can thus be employed to generate feedback/feedforward information that can be employed to control post exposure steps and which can thus facilitate achieving desired critical dimensions. For example, a first average depth and/or maximum and minimum depth may indicate that a first development temperature should be applied for a first development time and that a first post exposure bake temperature should be applied for a first post exposure bake time while a second average depth and/or maximum and minimum depth may indicate that a second development temperature should be applied for a second development time and that a second post exposure bake temperature should be applied for a second post exposure bake time.

By way of further illustration, the exposed resist 310 may also have a third feature 340 and a fourth feature 350 whose sides are sloped. Scatterometry techniques can be employed to determine what, if anything, the slopes indicate concerning exposure. Similarly, scatterometry techniques can be employed to determine, based on the slopes of the sides of the features 340 and/or 350, for example, development times and/or temperatures and/or post exposure bake times and/or temperatures to be applied to the exposed resist 310. For example, different slopes may generate different signatures that indicate one or more exposure results and which can thus be employed to generate feedback/feedforward information that can be employed to control post exposure processes and which can thus facilitate achieving desired critical dimensions. For example, a first average slope and/or maximum and minimum slope may indicate that a first development temperature should be applied for a first development time and that a first post exposure bake temperature should be applied for a first post exposure bake time while a second average slope and/or maximum and minimum slope may indicate that a second development temperature should be applied for a second development time and that a second post exposure bake temperature should be applied for a second post exposure bake time.

By way of further illustration, the chemical composition of the exposed resist 310 may also generate one or more signatures. Scatterometry techniques can be employed to determine what, if anything, the chemical composition indicates concerning exposure. Similarly, scatterometry techniques can be employed to determine, based on the chemical composition, development times and/or temperatures and/or post exposure bake times and/or temperatures to be applied to the exposed resist 310. For example, different chemical compositions may generate different signatures that indicate one or more exposure results and which can thus be employed to generate feedback/feedforward information that can be employed to control post exposure processes and which can thus facilitate achieving desired critical dimensions. For example, a first chemical composition may indicate that a first development temperature should be applied for a first development time and that a first post exposure bake temperature should be applied for a first post exposure bake time while a second chemical composition may indicate that a second development temperature should be applied for a second development time and that a second post exposure bake temperature should be applied for a second post exposure bake time.

Figure 4:
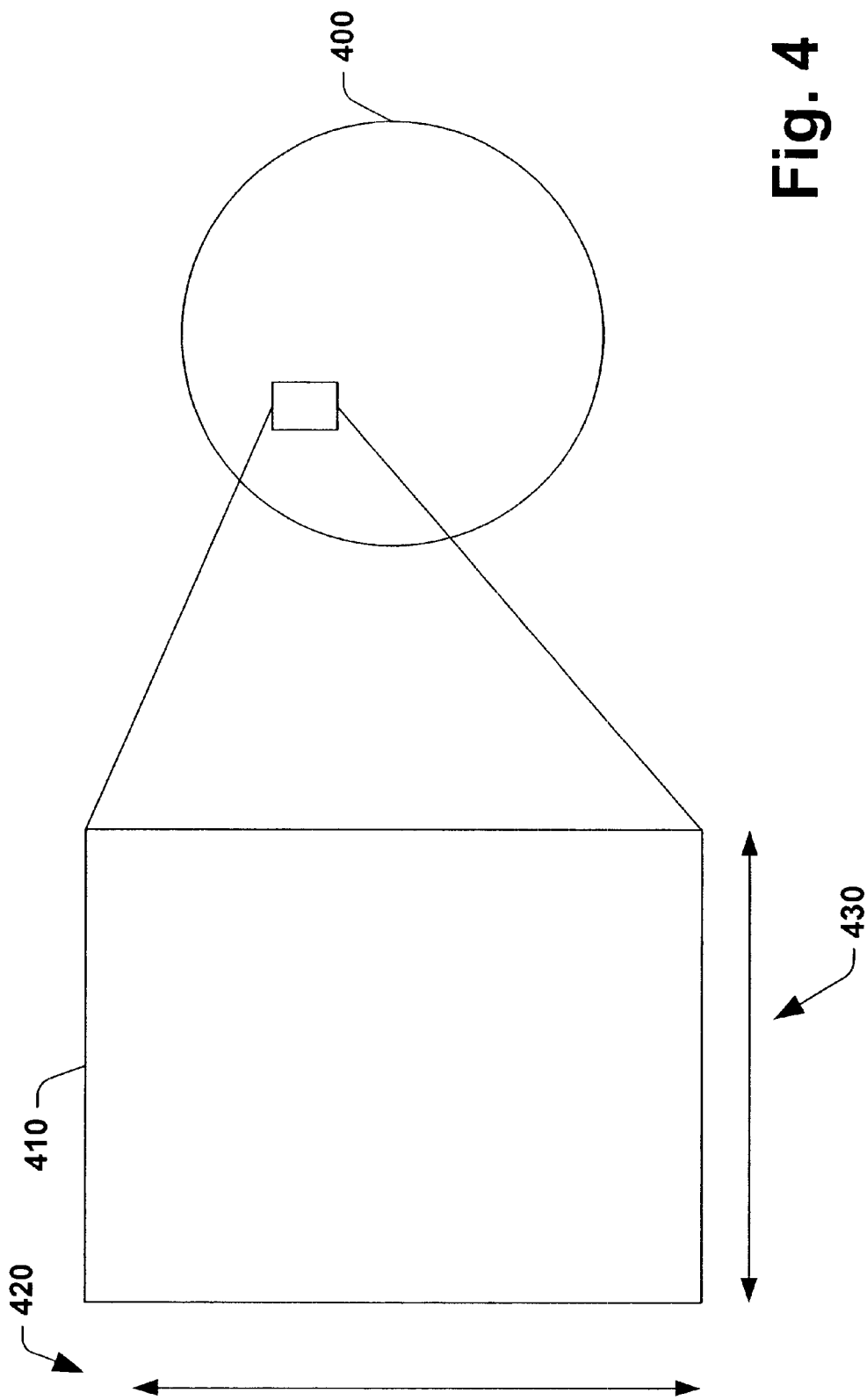
FIG. 4 illustrates critical dimension measurements employed in providing in situ control of integrated circuit manufacture, in accordance with an aspect of the present invention.

Turning now to FIG. 4, a top view of a wafer 400 upon which a latent image has been exposed is illustrated. The wafer may include one or more features 410, whose critical dimensions can be affected by exposure time and/or post exposure baking, for example. By way of illustration, a first measurement for the length 420 of the feature 410 may indicate that a first post exposure bake time should be employed in post exposure processes while a second measurement for the length 420 of the feature 410 may indicate that a second post exposure bake time should be employed in post exposure processes. Similarly, a first measurement for the width 430 of the feature 410 may indicate that a first post exposure bake time should be employed in post exposure processes while a second measurement for the width 430 of the feature 410 may indicate that a second post exposure bake time should be employed in post exposure processes. The critical dimension measurements (e.g., length 420, width 430) taken from the latent image may be correlated to facilitate producing feedback/feedforward information that can be employed to control post exposure processes. For example, the area of the feature 410, as determined by multiplying the length 420 by the width 430 may be employed in generating feedback/feedforward information that can be employed to control a post exposure development process.

Figure 5:
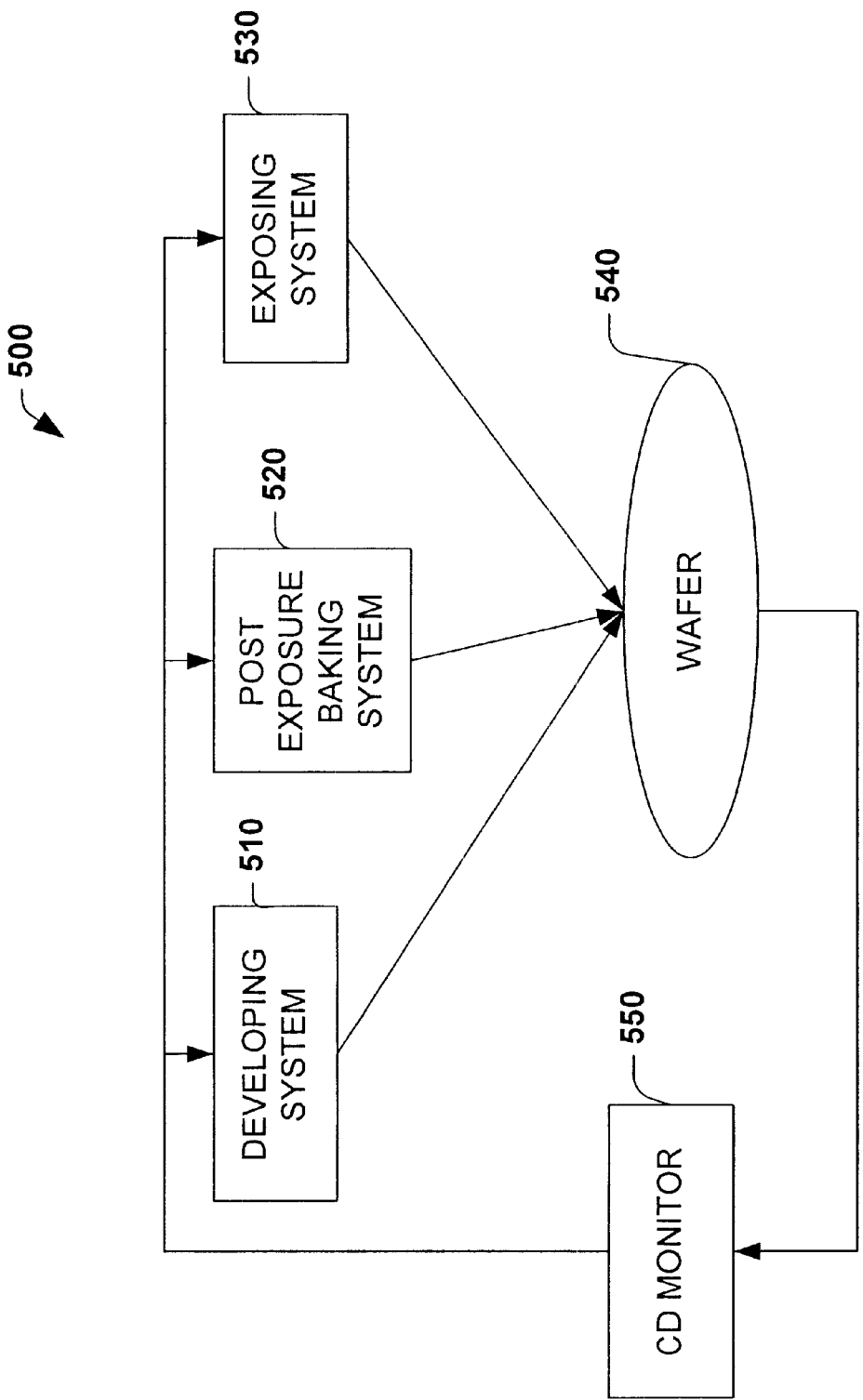
FIG. 5 is a schematic block diagram illustrating a critical dimension monitoring system providing in situ control of integrated circuit manufacture, in accordance with an aspect of the present invention.

Turning now to FIG. 5, a simplified schematic block diagram illustrates a feed forward system 500 employed in controlling post exposure processes based, at least in part, on critical dimension information collected from a latent image on a wafer 540. The system 500 includes an exposing system 530 that is employed to expose a pattern on a photo-resist. Exposing the pattern produces a latent image on the wafer 540, with features with measurable critical dimensions. The critical dimensions can be measured through scatterometry means and fed into a critical dimension monitor 550. The critical dimension monitor 550 can then be employed to generate feed forward information that is employed in controlling a developing system 510 and/or a post exposure baking system 520.

Figure 6:
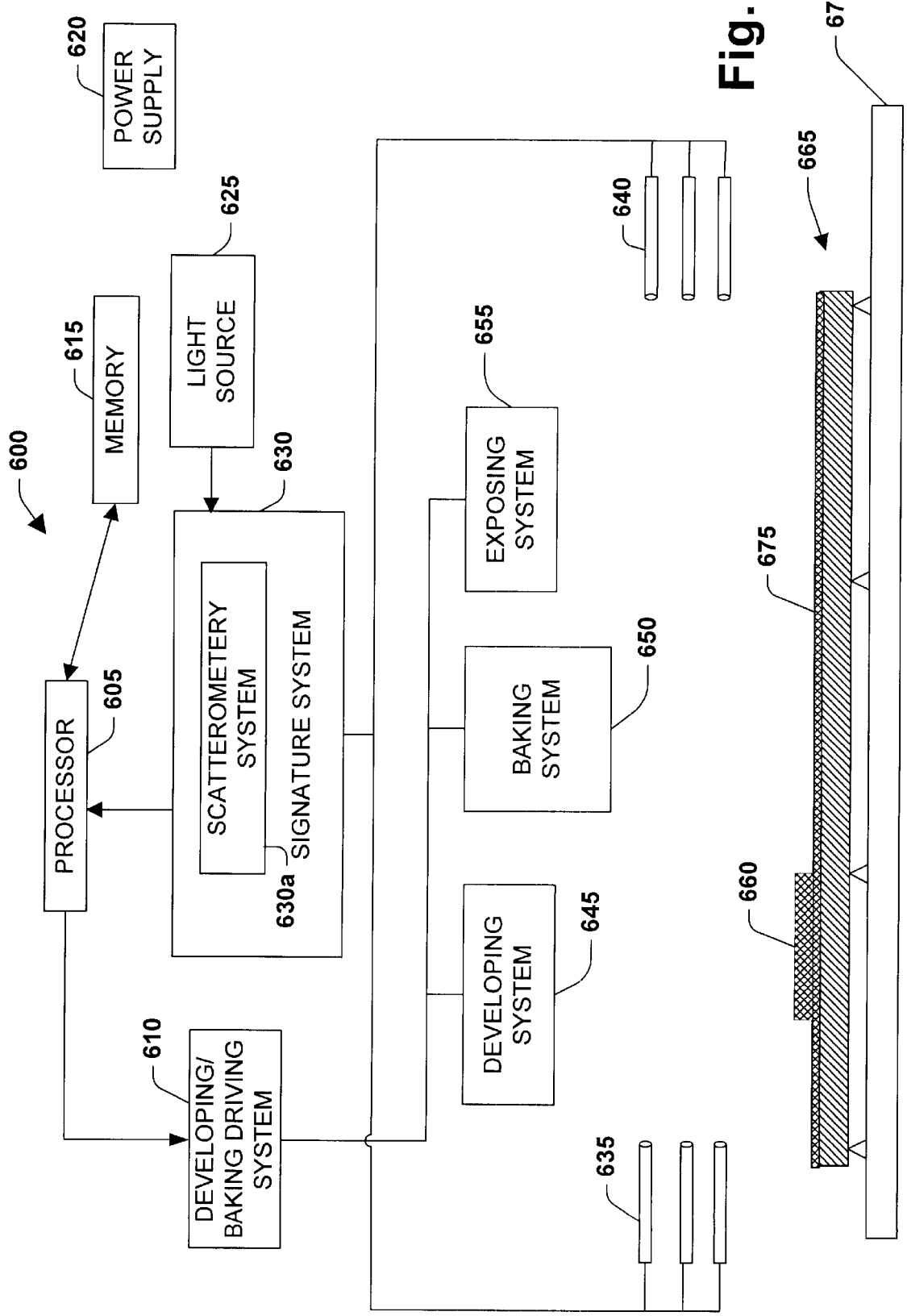
FIG. 6 is schematic block diagram of an exposing system monitoring and control system employed with developing and/or post exposure baking control systems in accordance with an aspect of the present invention.

Turning now to FIG. 6, a system 600 for monitoring exposure results of a pattern developed on a wafer 665 is shown. One or more latent images of a pattern have been exposed into the wafer 665. The latent image may include a grating 660. The grating 660 is formed on the wafer 665, as part of the latent image exposed into the photo resist 675, to facilitate analyzing critical dimensions in features in the latent image pattern exposed on the wafer 665. The system 600 further includes an exposing system 655 that is selectively controlled by the system 600 to facilitate controlling exposure of the pattern into the photo resist 675. The wafer 665 is supported on a chuck 670. Although one grating 660 is illustrated, it is to be appreciated that a greater number of gratings may be employed by the present invention. The gratings can be equal lines and/or spaces, and/or varying lines an/or spaces. In accordance with one aspect of the invention, linewidth ranges from 1 $\mu$m to 50 nm. Preferably, grating area is within a range of 100 $\mu$m×100 $\mu$m to 10 $\mu$m×10 $\mu$m so that a spot size of a light beam in accordance with the invention is smaller than the grating size. It is to be appreciated that the grating area and beam spot size can be suitably tailored and thus the subject invention should not be limited to any ranges noted herein as preferable.

One or more light sources 635 projects light onto respective portions of the wafer 665. The wafer 665 can be partitioned into one or more portions. The latent image exposed into the photo resist 675 can be located in one or more of the portions. Each portion of the wafer 665 can also have zero or more gratings 660 formed thereon. Light reflected, and/or passed through, the latent image and/or the gratings 660 is collected by one or more light detecting components 640, and processed by a signature system 630 to produce a signature that measures at least one parameter relating to the exposure of the latent image and/or gratings 660. By way of illustration, a signature associated with the latent image and/or one or more gratings 660 may indicate that the exposing system 635 should terminate exposure of the pattern that is forming the latent image in the photo resist 675. The reflected and/or passed through light is processed with respect to the incident light in measuring the various parameters. The reflected and/or passed through or transmitted light can generate one or more signatures associated with the latent image and/or the one or more gratings 660. The signatures can be employed to generate feedback control information that can be employed to control the exposure via the exposure driving system. The signatures can also be employed to generate feed forward information that can be employed by a developing system 645 and/or a baking system 650. By way of illustration, the signatures may indicate that the a first exposure result was produced by the exposing system 655 and thus a first development time and a first post exposure bake time should be employed to facilitate achieving desired critical dimensions in response to the first exposure result. By way of further illustration, the signatures may indicate that the a second exposure result was produced by the exposing system 655 and thus a second development time and a second post exposure bake time should be employed to facilitate achieving desired critical dimensions in response to the second exposure result.

The signature system 630 includes a scatterometry system 630a. It is to be appreciated that any suitable scatterometry system may be employed to carry out the present invention and such systems are intended to fall within the scope of the claims appended hereto.

A source of light 625 (e.g., a laser) provides light to the one or more light sources 635 via the signature system 630. Preferably, the light source 625 is a frequency stabilized laser, however, it will be appreciated that any laser or other light source (e.g., laser diode or helium neon (HeNe) gas laser) suitable for carrying out the present invention may be employed. One or more light detecting components 640 (e.g., photo detector, photo diodes) collect light reflecting from or passing through the latent image in the photo resist 675 and/or the one or more gratings 660.

A processor 605 receives the measured data from the signature system 630 and determines whether to terminate exposure of the pattern that is forming the latent image in the photo resist 675 by the exposing system 655 based, at least in part, on comparing signatures measured from the latent image and/or the one or more gratings 660 formed in the photo resist 675 to desired signatures. The processor 605 is operatively coupled to the signature system 630 and is programmed to control and operate the various components within the system 600 in order to carry out the various functions described herein. The processor, or CPU 605, may be any of a plurality of processors, such as the AMD ATHLON and other similar and compatible processors. The manner in which the processor 605 can be programmed to carry out the functions relating to the present invention will be readily apparent to those having ordinary skill in the art based on the description provided herein. A memory 615, which is operatively coupled to the processor 605, is also included in the system 600 and can store program code executed by the processor 605 for carrying out operating functions of the system 600 as described herein. The memory 615 also serves as a storage medium for temporarily storing information such as latent image signatures, grating signatures, exposure time, latent image signature tables, grating signature tables, component coordinate tables, latent image feature sizes, grating sizes, latent image feature shapes, grating shapes, scatterometry information, and other data that may be employed in carrying out the present invention.

A power supply 620 provides operating power to the system 600. Any suitable power supply 620 (e.g., battery, line power) can be employed to carry out the present invention. The processor 605 is also coupled to a developing/baking driving system 610 that drives a developing system 645 and/or a baking system 650. The developing/baking driving system 610 is controlled by the processor 605 to selectively cause the developing system 645 and/or the baking system 650 to change one or more properties including, but not limited to, development time, development temperature, post exposure bake time and post exposure bake temperature. In an alternative aspect of the present invention, the processor 605 monitors the signatures associated with the latent image exposed in the photo resist 675 and the one or more gratings 660 and selectively controls the exposing system 655. Similarly, the processor 605 monitors the signatures associated with the latent image exposed in the photo resist 675 and the one or more gratings 660 and generates feed forward information that can be employed to control the developing system 645 and/or the baking system 650. As a result, the system 600 provides for regulating how a wafer with a latent image exposed in the photo resist 675 will be developed and how a wafer with a latent image exposed in the photo resist 675 will be baked, which in turn improves fidelity of image transfer in a lithographic process. Improved image transfer fidelity facilitates achieving desired critical dimensions and thus smaller feature sizes and higher packing densities. Achieving substantially similar desired critical dimensions for different patterns on different layers improves IC quality, and facilitates higher speeds for such chips.

Figure 7:
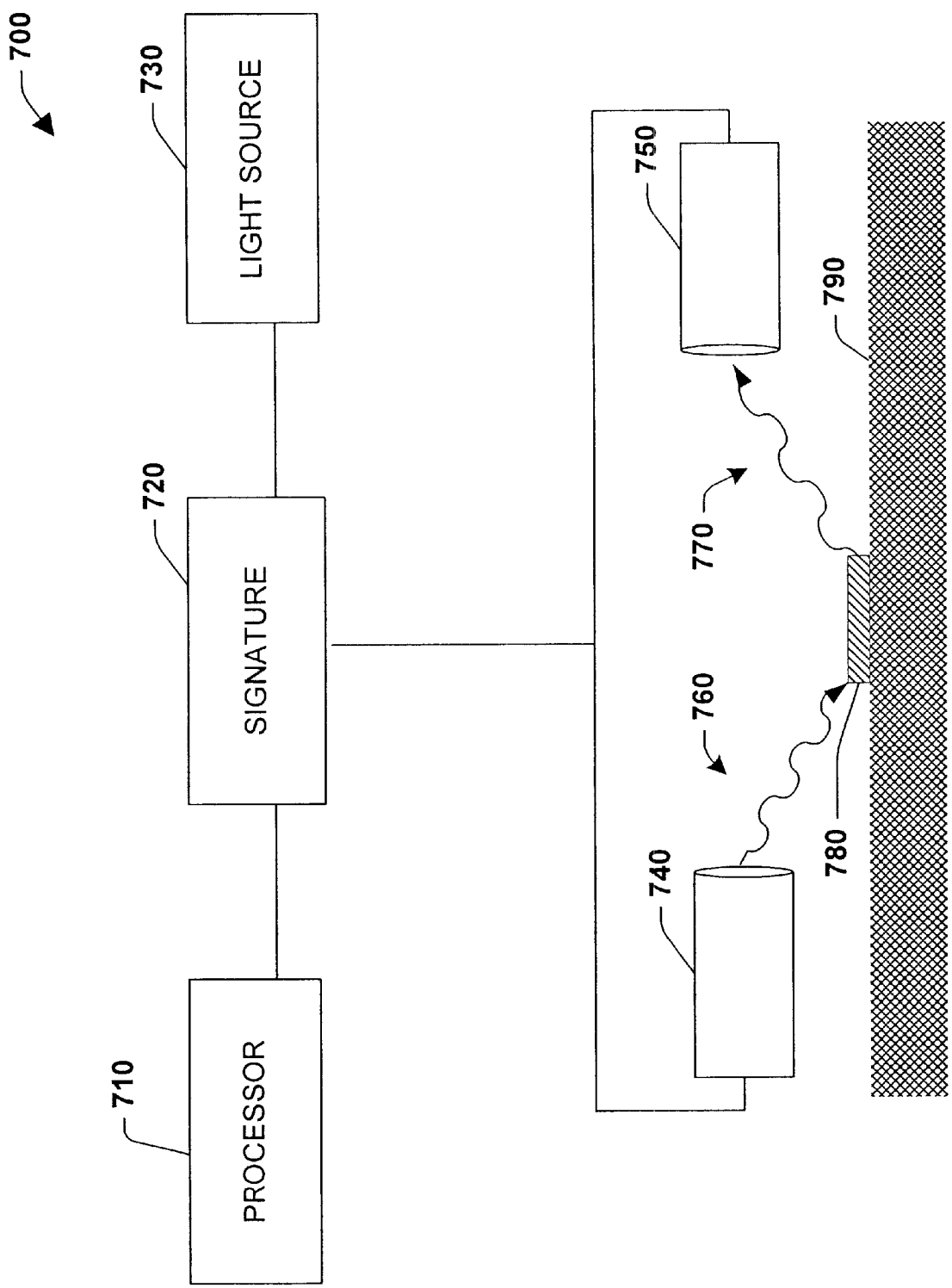
FIG. 7 is a partial schematic block diagram of a signature system being employed in connection with determining latent image properties in accordance with the an aspect of present invention.

FIG. 7 illustrates a portion of a system 700 being employed to generate one or more signatures for a latent image and/or a grating 780 formed in photo resist 790. A light source 730 provides a light to one or more light emitters 740 that direct a light 760 incident to the surface of the photo resist 790. The reflected light 770 from the surface of the photo resist 790 will vary (e.g., variations in intensity and/or phase) in accordance with the critical dimensions achieved and/or chemical composition for the latent image and/or the grating 780. One or more light detecting components 750 collect the reflected light 770, pass the collected light, and/or data concerning the collected light, to a signature system 720, which processes the reflected light 770 and/or data concerning the reflected light 770 in accordance with suitable techniques (e.g., scatterometry, spectroscopic ellipsometry) to provide a processor 710 with grating signature data. The reflected light 770 can be analyzed to generate one or more signatures that can be compared to one or more stored signatures to determine whether, for example, the latent image and/or the grating 780 has achieved desired critical dimensions and thus, whether exposure should be concluded. Similarly, the reflected light 770 can be analyzed to generate one or more signatures that can be compared to one or more stored signatures to generate, for example, feed forward information that can be employed to control post exposure processes including, but not limited to, a development process and a post exposure bake process.

Thus, through analyzing signatures collected during processing associated with FIG. 7, more optimal exposure can be achieved and/or post exposure processes can be adapted to actual conditions produced by the exposure, thus facilitating achieving desired critical dimensions.

Turning now to FIGS. 8–10 a chuck 900 is shown in perspective supporting a wafer 910 whereupon a photo resist exposed with a latent image (including zero or more gratings (e.g., 660, FIG. 6) is exposed. The wafer 910 may be divided into a grid pattern as shown in FIG. 9. Each grid block (XY) of the grid pattern corresponds to a particular portion of the wafer 910, and each grid block has a portion of the latent image (including zero or more gratings (e.g., 660, FIG. 6)) associated with that grid block. Each portion is monitored individually for signatures generated by the latent image and or the one or more gratings (e.g., 660, FIG. 6).

In FIG. 9, one or more portions of the latent image (include one or more gratings (e.g., 660, FIG. 6)) in the respective portions of the wafer 910 ($X_1Y_1 \ldots X_{12}, Y_{12}$) are being monitored for signatures using reflective and/or passed through light, a signature system and a processor. It is to be appreciated that although FIG. 9 illustrates the wafer 910 being mapped (partitioned) into 144 grid block portions, the wafer 910 may be mapped with any suitable number of portions and any suitable number of gratings (e.g., 660, FIG. 6) may be employed. Given the set of recorded signatures, a processor may determine that an undesirable exposure condition exists. Similarly, a processor may generate feed forward information to provide to post exposure processes including, but not limited to, developing processes and baking processes. Accordingly, the processor may control systems including, but not limited to, an exposing system, a development system and a baking system. It is to be appreciated that the exposing system may be driven so as to maintain, terminate, and/or adjust exposure. It is to be further appreciated that the development system may be driven so as to establish, maintain, and/or adjust development properties including, but not limited to, time, temperature and atmosphere. It is to be further appreciated that the baking system may be driven so as to establish, maintain, and/or adjust baking properties including, but not limited to, time and temperature.

FIG. 10 illustrates a table of expected and unexpected signatures. It can be seen that all the signatures are expected except a signature for grid $X_7Y_6$. The set of depicted signatures can be analyzed collectively as a master signature, can be analyzed in subsets to evaluate, for example, intermediate exposure results and/or may be analyzed individually to determine whether an acceptable exposure has occurred. The analysis of the signatures can be employed to control systems including, but not limited to, an exposing driving system, a development system and a baking system, so that more precise critical dimensions may be achieved.

Figure 11:
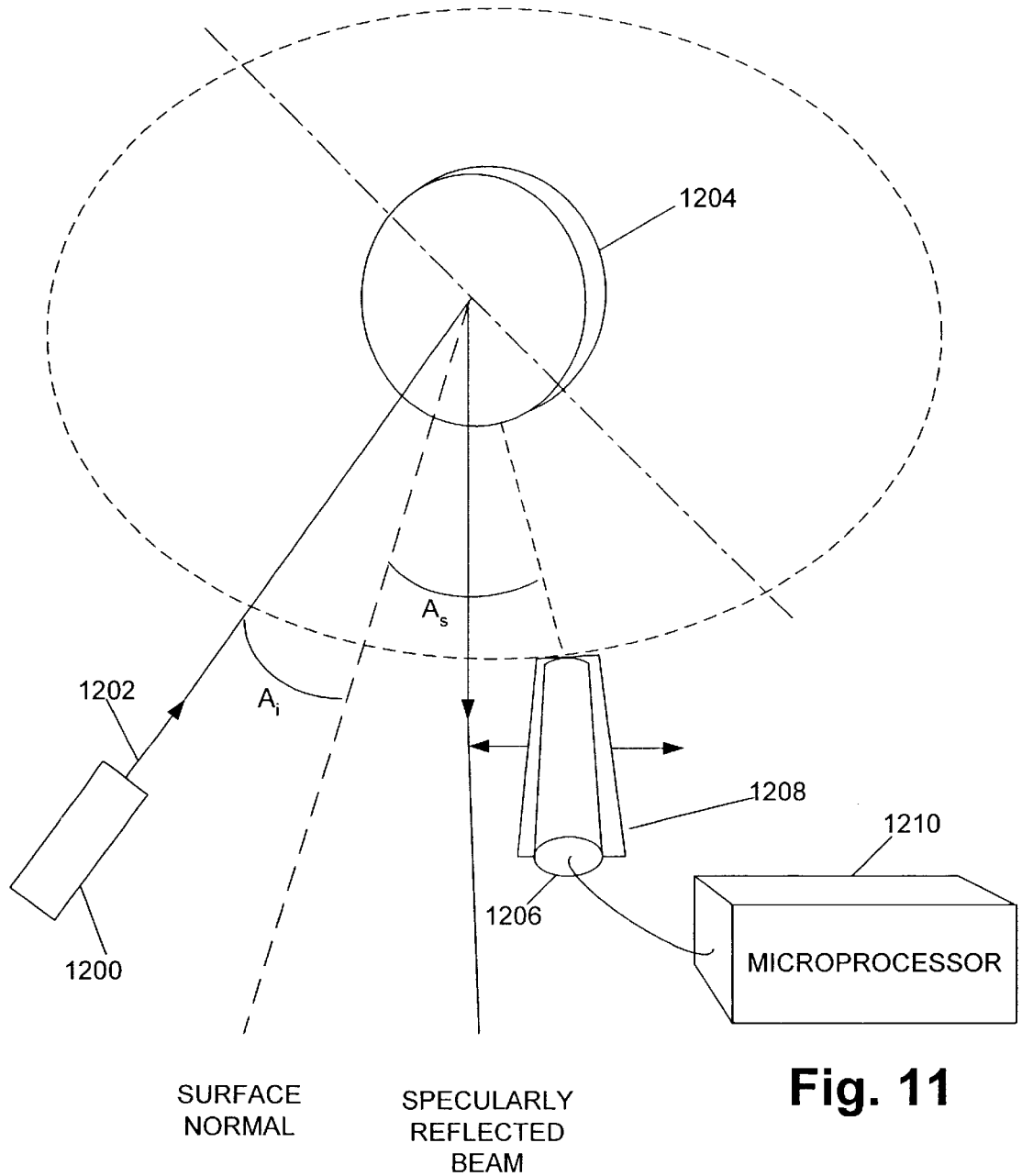
FIG. 11 illustrates an exemplary scatterometry system collecting reflected light.

FIG. 11 illustrates an exemplary scatterometry system collecting reflected light. Light from a laser 1200 is brought to focus in any suitable well-known manner to form a beam 1202. A sample, such as a wafer 1204 is placed in the path of the beam 1202 and a photo detector or photo multiplier 1206 of any suitable well-known construction. Different detector methods may be employed to determine the scattered power. To obtain a grating pitch, the photo detector or photo multiplier 1206 may be mounted on a rotation stage 1208 of any suitable well-known design. A microprocessor 1210, of any suitable well-known design, may be used to process detector readouts, including, but not limited to, angular locations of different diffracted orders leading to diffraction grating pitches being calculated. Thus, light reflected from the sample 1204 may be accurately measured.

Figure 12:
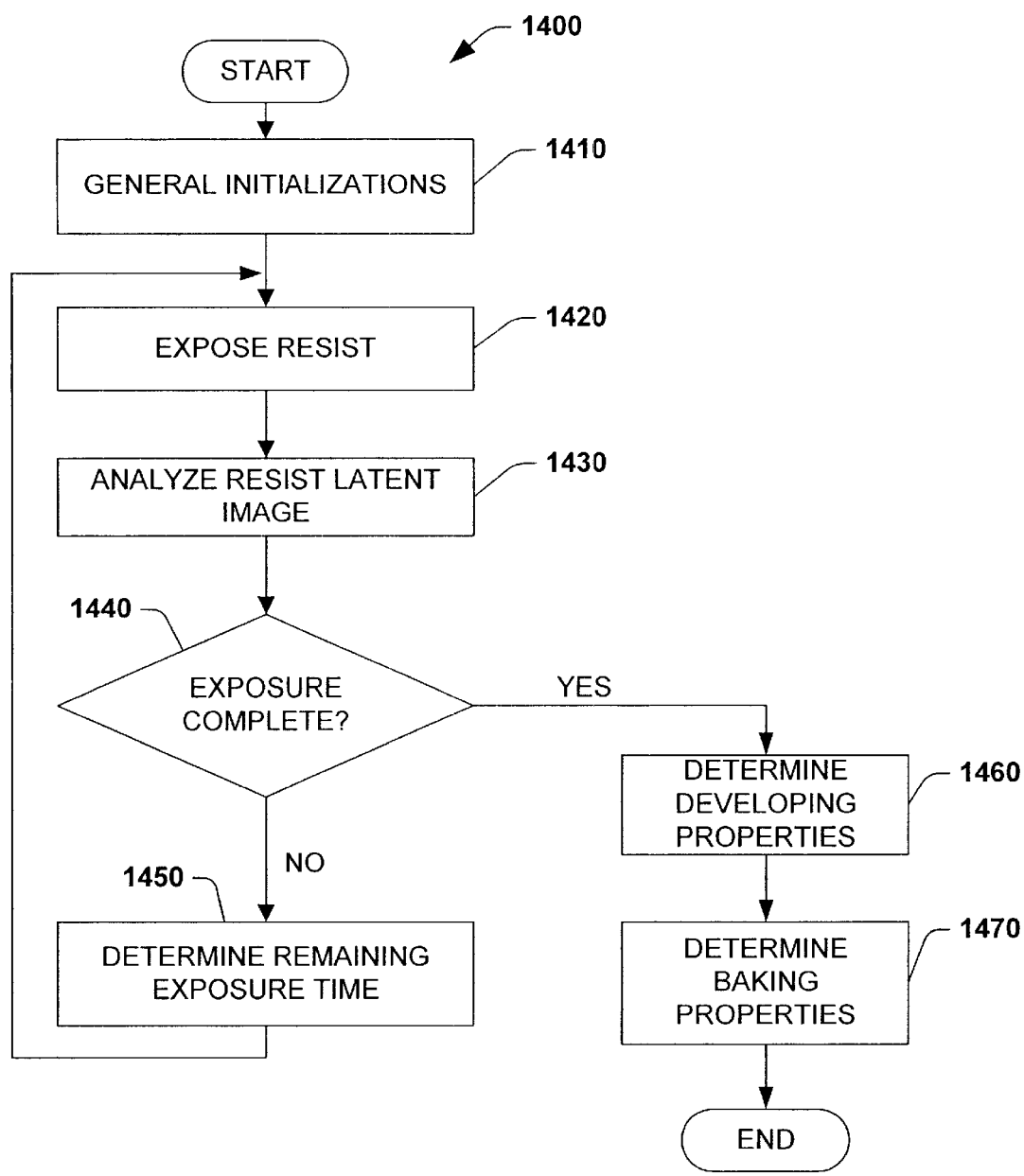
FIG. 12 is a flow diagram illustrating one specific methodology for carrying out the present invention.
Figure 13:
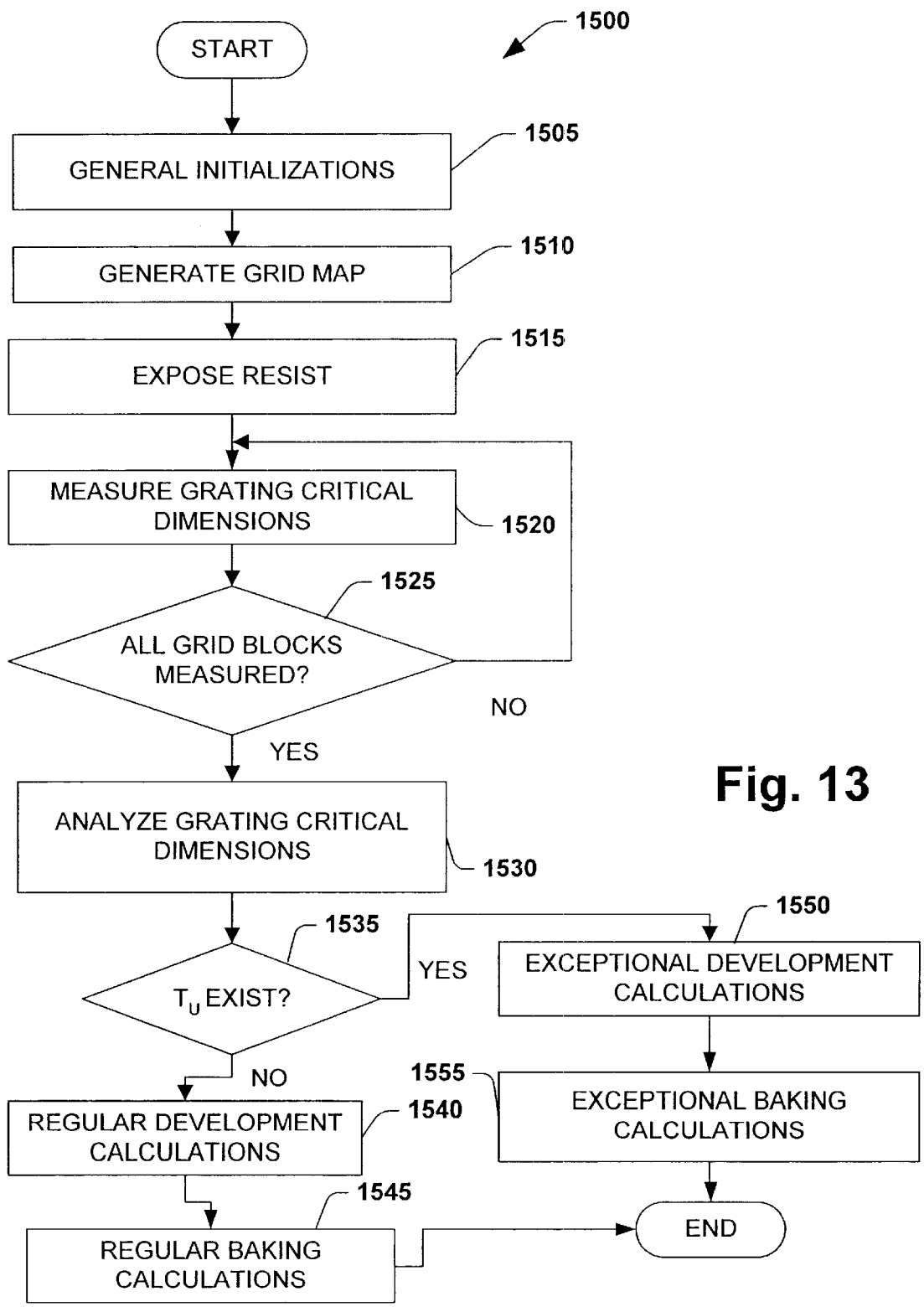
FIG. 13 is a flow diagram illustrating one specific methodology for carrying out an aspect of the present invention.

In view of the exemplary systems shown and described above, methodologies, which may be implemented in accordance with the present invention, will be better appreciated with reference to the flow diagrams of FIG. 12 and FIG. 13. While, for purposes of simplicity of explanation, the methodologies are shown and described as a series of function blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. It is to be appreciated that the various blocks may be implemented via software, hardware a combination thereof or any suitable means (e.g., device, system, process, component) for carrying out the functionality associated with the blocks. It is also to be appreciated that the blocks are merely to illustrate certain aspects of the present invention in a simplified form and that these aspects may be illustrated via a lesser and/or greater number of blocks.

FIG. 12 is a flow diagram illustrating a methodology 1400 for carrying out aspects of the present invention. At 1400 general initializations occur. Such initializations can include, but are not limited to, acquiring memory, acquiring resources, establishing data communications, establishing variables and instantiating one or more objects. At 1420, a pattern is exposed onto a photo resist. Exposing the pattern onto the photo resist will cause a latent image to begin to form on the photo resist. At 1430, scatterometry techniques are employed to analyze the emerging latent image. At 1440, a determination is made concerning whether exposure of the pattern has completed. For example, properties including, but not limited to the depth, width, slope and chemical composition of features in the latent image can be analyzed. If the determination at 1440 is NO, then at 1450 an estimated remaining exposure time can be calculated, and the process can continue at 1420.

If the determination at 1440 is YES, that exposure is complete then at 1460 properties associated with a post exposure development process can be calculated. For example, properties including, but not limited to, development time, development temperature and development atmosphere composition can be determined. Information concerning such properties can be fed forward to a subsequent development process, thus facilitating achieving desired critical dimensions with resulting improvements in chip quality. Thus, the post exposure development process can be adapted in reaction to scatterometry measurements associated with the exposure process, facilitating improvements in chip quality, and providing an improvement over conventional systems.

At 1470, properties associated with a post exposure baking process can be calculated. For example, properties including, but not limited to, baking time, baking temperature and baking atmosphere composition can be determined. Information concerning such properties can be fed forward to a subsequent baking process, thus facilitating achieving desired critical dimensions with resulting improvements in chip quality.

FIG. 13 is a flow diagram illustrating a methodology 1500 for carrying out aspects of the present invention. At 1505, general initializations are performed. Such initializations can include, but are not limited to, acquiring memory, acquiring resources, establishing data communications, establishing variables and instantiating one or more objects. At 1510, a grid map comprising a plurality of grid blocks "XY" is generated. At 1515, one or more gratings are exposed and begin forming part of a latent image on a photo resist. Zero or more gratings may be exposed in each of the grid blocks "XY". At 1520, scatterometry techniques are employed to measure properties of the gratings of 1515. Properties including, but not limited to, height, width, depth and chemical composition can be measured. The scatterometry techniques of 1520 can include, but are not limited to, analyzing grating signatures. At 1525, a determination is made concerning whether all grid blocks have been measured. If the determination at 1525 is NO, then processing returns to 1520. If the determination at step 1525 is YES, then at 1530, one or more signatures are produced and compared to acceptable signatures to determine results generated by the exposure of 1515. At 1535, a determination is made concerning whether an unexpected signature has been encountered. If the determination at 1535 is NO, then at 1540 regular techniques can be employed to determine post exposure developer properties and at 1545 regular techniques can be employed to determine post exposure bake properties. By way of illustration, if the latent image has dimensions and/or properties within expected ranges and/or tolerances, as indicated by one or more signatures read from the one or more gratings, then a simple table lookup value, or "proceed as normal" signal can be fed forward to post exposure developing and/or baking processes. But if the determination at 1535 is YES, that an unexpected signature was encountered, then at 1550, techniques for computing post exposure developer properties when the latent image has dimensions and/or properties outside expected ranges and/or tolerances, as indicated by one or more signatures read from one or more gratings, can be employed. For example, data generated by sophisticated modeling techniques can be fed forward to a post exposure development process to facilitate achieving desired critical dimensions even though exposure generated unexpected properties and/or dimensions. Similarly, at 1555, techniques for computing post exposure baking properties when the latent image has dimensions and/or properties outside expected ranges and/or tolerances, as indicated by one or more signatures read from one or more gratings, can be employed. For example, data generated by sophisticated neural network processing techniques can be fed forward to a post exposure baking process to facilitate achieving desired critical dimensions even though exposure generated unexpected properties and/or dimensions.

Scatterometry is a technique for extracting information about a surface upon which an incident light has been directed. Information concerning properties including, but not limited to, dishing, erosion, profile, chemical composition, thickness of thin films and critical dimensions of features present on a surface such as a wafer can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 14:
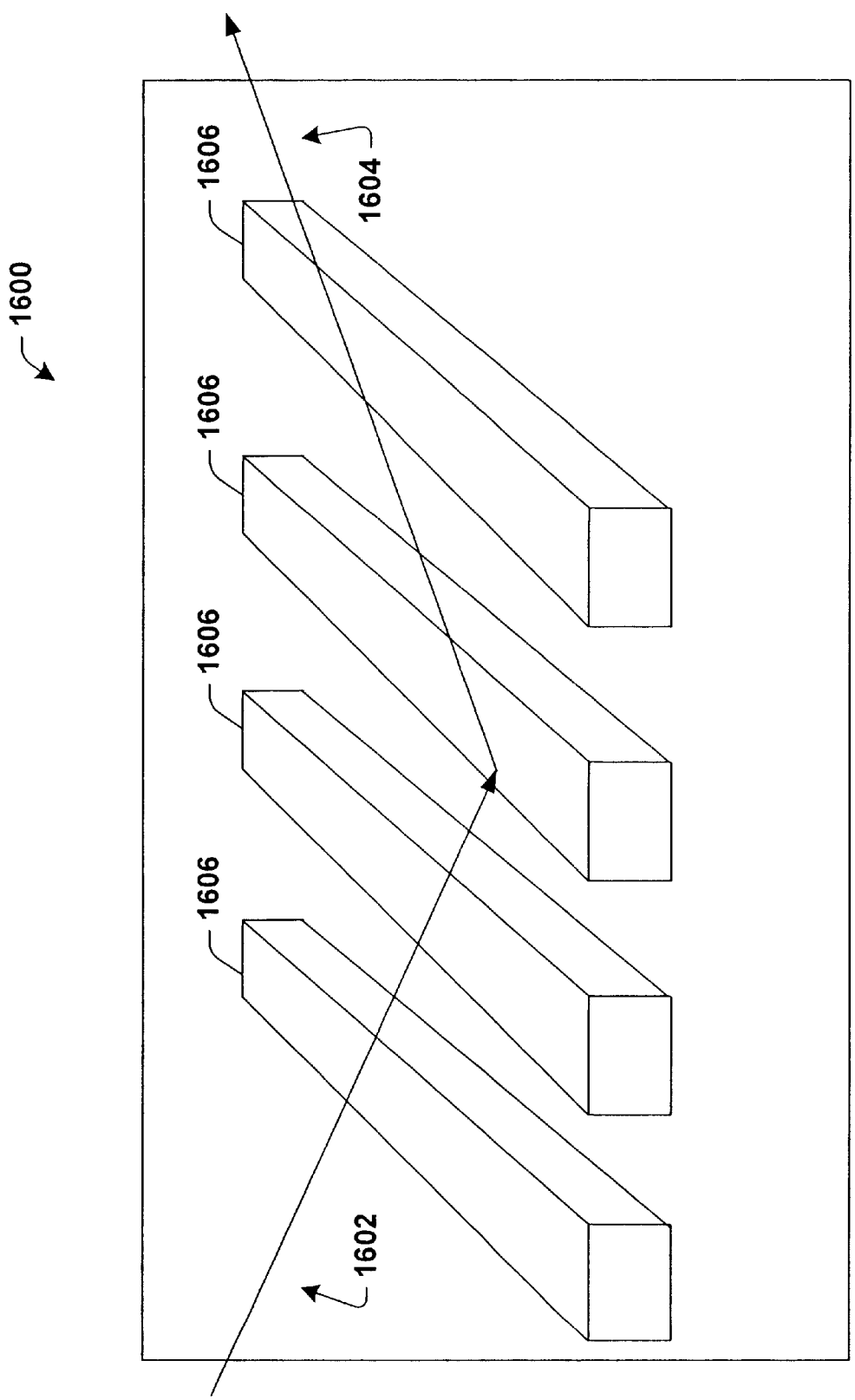
FIG. 14 is a simplified perspective view of an incident light reflecting off a surface, in accordance with an aspect of the present invention.
Figure 19:
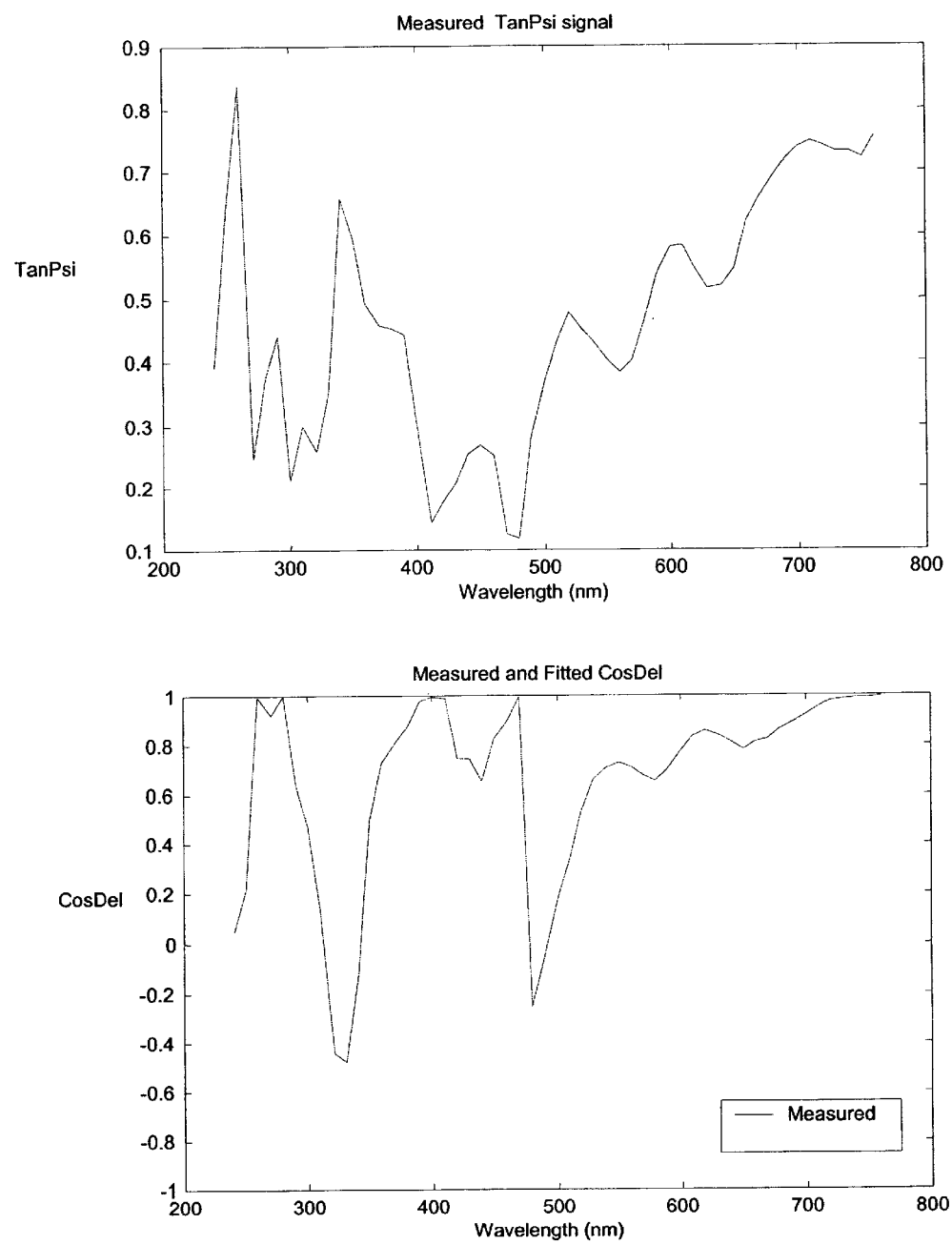
FIG. 19 illustrates phase and intensity signals recorded from a complex reflected and refracted light produced when an incident light is directed onto a surface, in accordance with an aspect of the present invention.

To illustrate the principles described above, reference is now made to FIGS. 14 through 19. Referring initially to FIG. 14, an incident light 1602 is directed at a surface 1600, upon which one or more features 1606 may exist. In FIG. 14 the incident light 1602 is reflected as reflected light 1604. The properties of the surface 1600, including but not limited to, thickness, uniformity, planarity, chemical composition and the presence of features, can affect the reflected light 1604. In FIG. 14, the features 1606 are raised upon the surface 1600. The phase and intensity of the reflected light 1604 can be measured and plotted, as shown, for example, in FIG. 19. The phase 2100 of the reflected light 1604 can be plotted, as can the intensity 2110 of the reflected light 1604. Such plots can be employed to compare measured signals with signatures stored in a signature library using techniques like pattern matching, for example.

Figure 15:
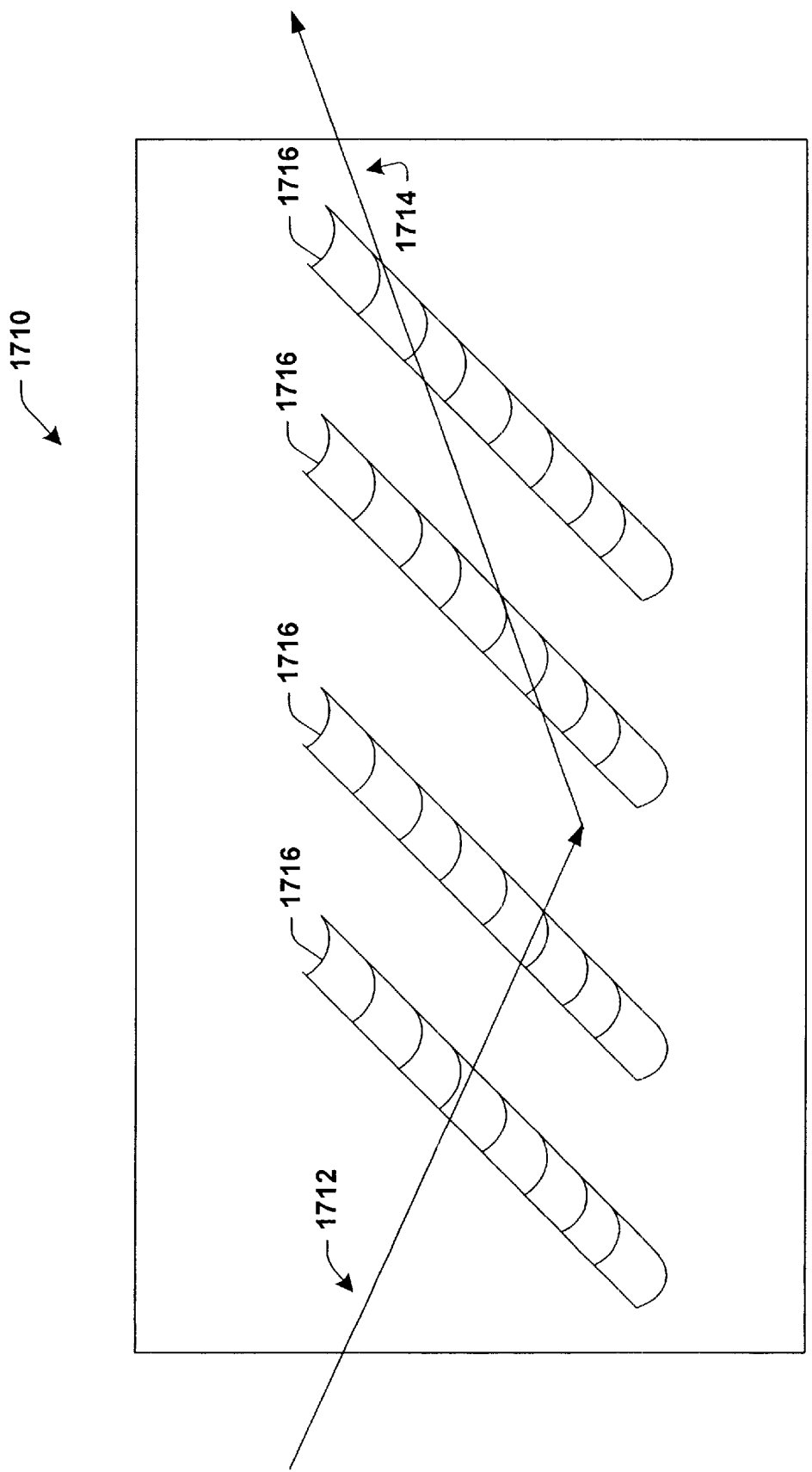
FIG. 15 is a simplified perspective view of an incident light reflecting off a surface, in accordance with an aspect of the present invention.

Referring now to FIG. 15, an incident light 1712 is directed onto a surface 1710 upon which one or more depressions 1716 appear. The incident light 1712 is reflected as reflected light 1514. Like the one or more features 1606 (FIG. 14) may affect an incident beam, so too may the one or more depressions 1716 affect an incident beam. Thus, it is to be appreciated that scatterometry can be employed to measure features appearing on a surface, features appearing in a surface, and properties of a surface itself, regardless of features.

Figure 16:
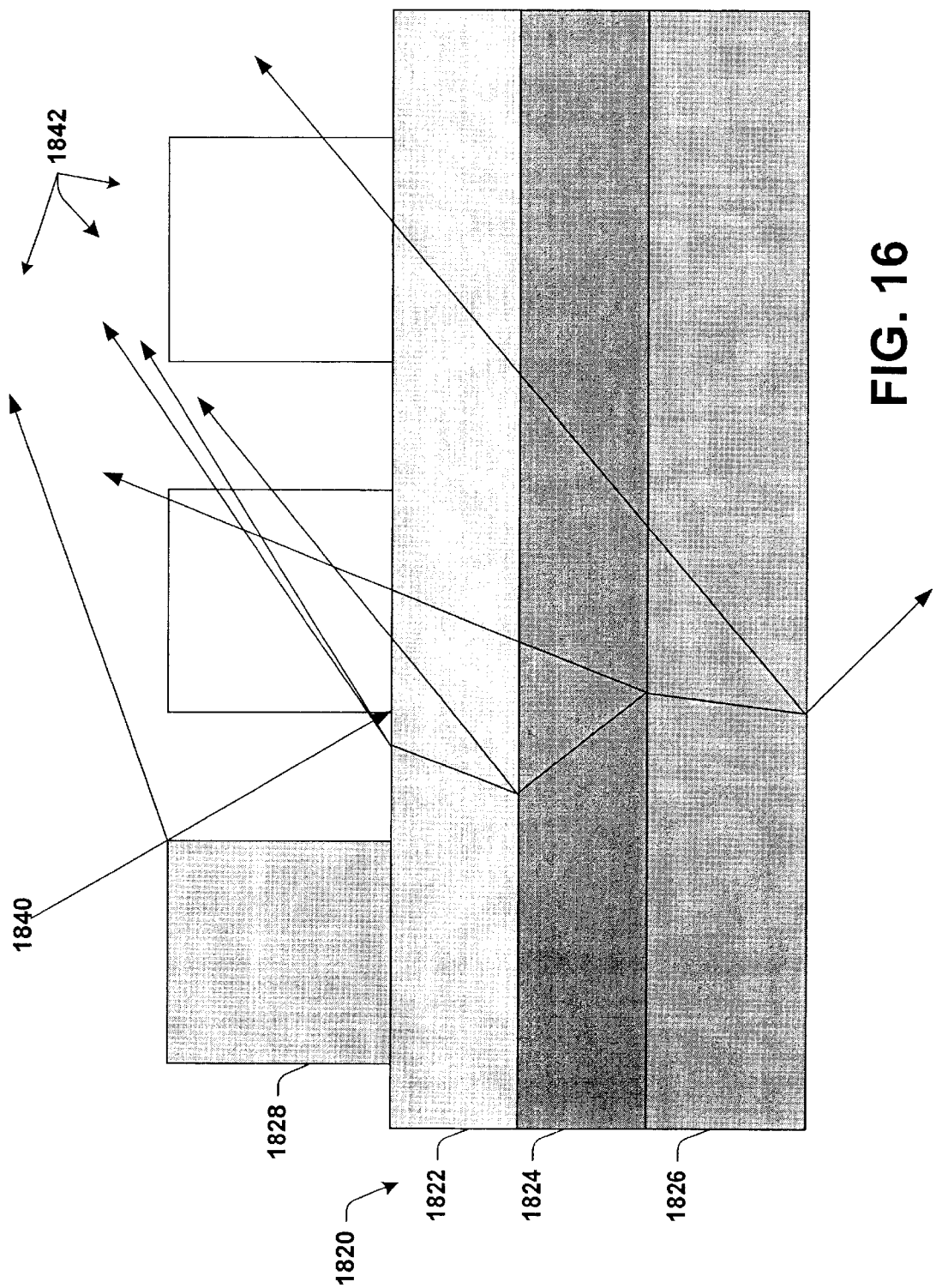
FIG. 16 illustrates a complex reflected and refracted light produced when an incident light is directed onto a surface, in accordance with an aspect of the present invention.

Turning now to FIG. 16, complex reflections and refractions of an incident light 1840 are illustrated. The reflection and refraction of the incident light 1840 can be affected by factors including, but not limited to, the presence of one or more features 1828, and the composition of the substrate 1820 upon which the features 1828 reside. For example, properties of the substrate 1820 including, but not limited to the thickness of a layer 1822, the chemical composition of the layer 1822, the opacity and/or reflectivity of the layer 1822, the thickness of a layer 1824, the chemical composition of the layer 1824, the opacity and/or reflectivity of the layer 1824, the thickness of a layer 1826, the chemical composition of the layer 1826, and the opacity and/or reflectivity of the layer 1826 can affect the reflection and/or refraction of the incident light 1840. Thus, a complex reflected and/or refracted light 1842 may result from the incident light 1840 interacting with the features 1828, and/or the layers 1822, 1824 and 1826. Although three layers 1822, 1824 and 1826 are illustrated, it is to be appreciated that a substrate can be formed of a greater or lesser number of such layers.

Figure 17:
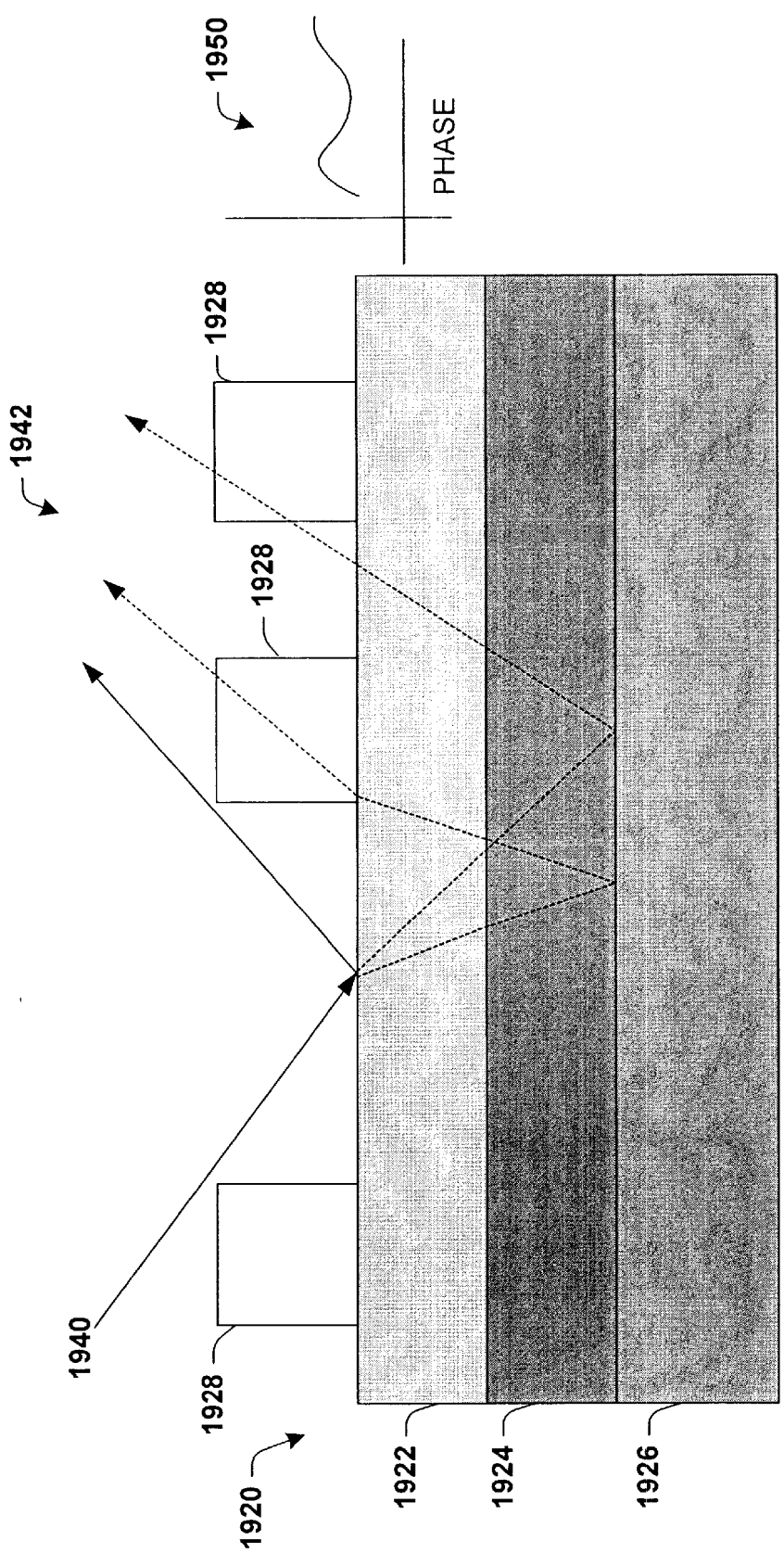
FIG. 17 illustrates a complex reflected and refracted light produced when an incident light is directed onto a surface, in accordance with an aspect of the present invention.
Figure 18:
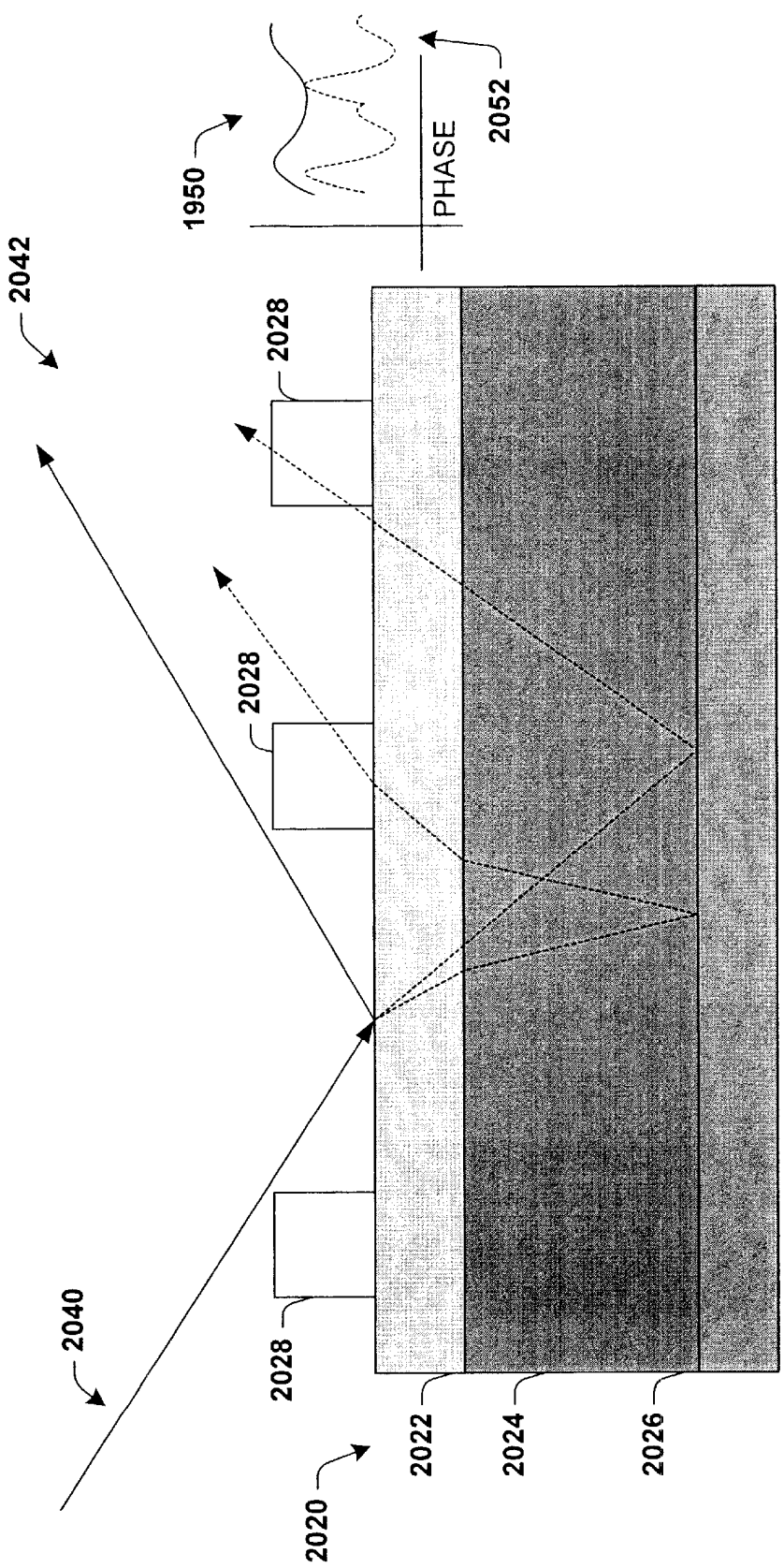
FIG. 18 illustrates a complex reflected and refracted light produced when an incident light is directed onto a surface, in accordance with an aspect of the present invention.

Turning now to FIG. 17, one of the properties from FIG. 16 is illustrated in greater detail. The substrate 1920 can be formed of one or more layers 1922, 1924 and 1926.

The phase 1950 of the reflected and/or refracted light 1942 can depend, at least in part, on the thickness of a layer, for example, the layer 1924. Thus, in FIG. 18, the phase 2052 of a reflected light 2042 differs from the phase 1950 due, at least in part, to the different thickness of the layer 2024 in FIG. 18 from the thickness of the layer 1924 in FIG. 17.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A system for analyzing a latent image exposed in a photo resist and for generating information to facilitate controlling a post exposure developing process in semiconductor manufacturing, comprising:

an exposing system adapted to expose one or more patterns on one or more photo resist layers on a wafer;

a developing system adapted to develop a photo resist;

a developing driving system adapted to control the developing system;

a post exposure baking system adapted to harden the photo resist;

a baking driving system adapted to control the post exposure baking system;

one or more light sources adapted to direct light to at least one portion of the wafer;

one or more light collectors adapted to collect a light reflected from the at least one portion of the wafer;

a signature system adapted to produce a signature from the light reflected from the at least one portion of the wafer; and a processor operatively coupled to the signature system, the developing system, and the post exposure baking system, the processor receiving one or more signatures from the signature system and the processor adapted to employ the one or more signatures to control the developing system and the post exposure baking system.

2. The system of claim 1, wherein the signature system further comprises a scatterometry system, the scatterometry system adapted to process the light reflected from the at least one portion of the wafer and the scatterometry system further adapted to produce one or more signatures based on the reflected light.

3. The system of claim 2, where the processor is operatively coupled to the scatterometry system, where the processor is further adapted to analyze the one or more signatures and to control the developing system based at least partially on the one or more signatures.

4. The system of claim 3, wherein the scatterometry system is further adapted to process a light passing through the at least one portion, the light passing through the at least one portion being employed to produce the one or more signatures.

5. The system of claim 3, wherein the processor is further adapted to map the wafer into a plurality of grid blocks and to analyze signatures generated by light reflected from the one or more grid blocks.

6. The system of claim 5, wherein one or more gratings are exposed in at least one of the one or more grid blocks.

7. The system of claim 6, wherein the signature system is further adapted to produce one or more signatures from a light reflected from at least one of the one or more gratings.

8. A method for analyzing light reflected from a latent image exposed in a photo resist and for controlling a post exposure developing system, comprising:

partitioning a wafer into one or more portions;

exposing a pattern in the one or more portions, the exposing producing a latent image in the photo resist;

directing a light onto the latent image;

collecting a light reflected from the latent image;

analyzing the reflected light to produce one or more signatures associated with the latent image;

generating data used in connection with controlling the post exposure developing system based, at least in part, on the one or more signatures; and generating data operable to control a post exposure baking system based, at least in part, on the one or more signatures.

9. The method of claim 8, wherein analyzing the reflected light further comprises using a scatterometry system to process the reflected light.

10. A method for regulating a post exposure developing process, comprising:

partitioning a wafer into a plurality of grid blocks, the wafer having a photo resist layer deposited thereon;

exposing one or more gratings on the photo resist layer, the gratings positioned within one or more of the plurality of grid blocks;

directing a first light onto at least one of the one or more gratings;

collecting a second light reflected from at least one of the one or more gratings, the second reflected light being a reflection of the first light;

generating feedback information concerning the exposure, based, at least in part, on analyzing the second light;

controlling an exposing system based, at least in part, on the feedback information;

generating feed forward information concerning the exposure, based, at least in part, on analyzing the second light;

controlling a post exposure developing process based, at least in part, on the feed forward information; and controlling a post exposure baking process based, at least in part, on the feed forward information.

11. A computer readable medium containing computer executable components operable to perform the method of claim 10.

* * * * *